United States Patent [19]
Coules

[11] 3,836,703

[45] Sept. 17, 1974

[54] CIRCUIT BOARD SPACER-SUPPORT

[75] Inventor: Ronald A. Coules, Chicago, Ill.

[73] Assignee: Richco Plastic Company, Chicago, Ill.

[22] Filed: Oct. 19, 1973

[21] Appl. No.: 408,073

[52] U.S. Cl................. 174/138 D, 24/73 P, 85/5 R, 85/80, 317/101 CC

[51] Int. Cl........ H05k 7/12, F16b 5/06, F16b 19/00

[58] Field of Search........ 174/138 R, 138 D, 138 G, 174/153 R, 158 R; 317/101 CC, 101 CM, 101 CW, 101 D, 101 DH; 24/73 P, 73 PF, 73 PM, 73 HS, 73 MF, 73 D, 213 R, 213 CS, 214; 85/5 R, 80, DIG. 2

[56] References Cited

UNITED STATES PATENTS

| | | | |
|---|---|---|---|
| 2,936,015 | 5/1960 | Rapata | 85/80 |
| 2,984,698 | 5/1961 | Strauss | 174/138 R |
| 3,154,281 | 10/1964 | Frank | 24/214 X |
| 3,688,635 | 9/1972 | Fegen | 174/138 D UX |
| 3,777,052 | 12/1973 | Fegen | 174/138 D |

*Primary Examiner*—Laramie E. Askin

[57] ABSTRACT

A one-piece spacer-support for a circuit board fabricated from plastic dielectric material and having resiliently flexible means for securing it to a chassis and an apertured top wall upon which a circuit board is seated and secured thereto as by means of another spacer-support or the like.

6 Claims, 4 Drawing Figures

CIRCUIT BOARD SPACER-SUPPORT

The invention relates to spacer-supports for mounting components and electronic equipment, and is more particularly concerned with a circuit board support of plastic dielectric insulating material which may be used singly or in multiples to support and secure one or more circuit boards or panels on a chassis.

The spacer-support embodying the present invention comprises a rigid support member having on its lower end a flexible member for locking the support in upright position on a chassis or circuit board. The spacer-support herein cisclosed is sufficiently versatile to accommodate a variety of chassis or circuit board thicknesses. Further, the spacer-support herein disclosed permits stacking of circuit boards as to permit overlying circuit boards to be piled in spaced relation to one another within a given area.

It is therefore an object of the invention to provide a spacer-support of the character referred to.

Another object is to provide a spacer-support of the character referred to which will lockingly engage one with another and with a chassis, and will permit disassembly readily should replacement or repair of a circuit board be required.

Another object is to provide a spacer-support that can be used to mount one or more circuit boards in superimposed relation on a chassis.

Another object is to provide a one-piece spacer-support which is not difficult to manufacture but which is simple to use without installation hardware or tools.

Other objects and advantages of the invention will become apparent with reference to the following description and the accompanying drawings.

Figure 1:
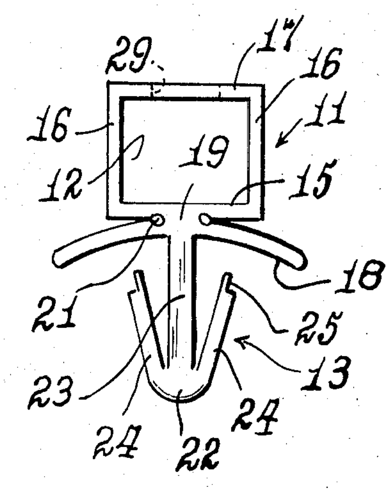
FIG. 1 is a front elevational view of the spacer-support.
Figure 2:
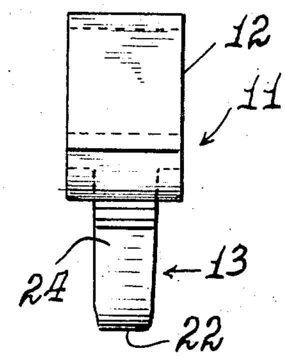
FIG. 2 is a side elevational view of the spacer-support shown in FIG. 1.
Figure 4:
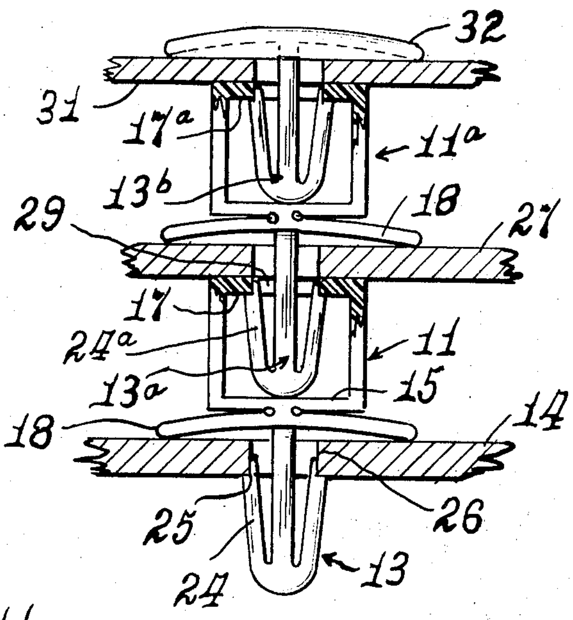
FIG. 4 is an elevational view of a plurality of spacer-supports mounted on a chassis and supporting several spaced apart circuit boards.
Figure 3:
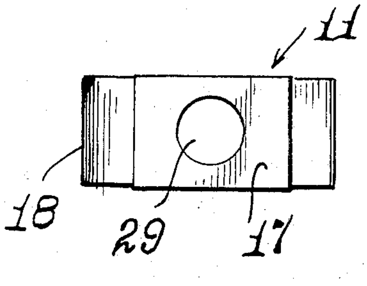
FIG. 3 is a top plan view of the spacer-support.

Referring to the exemplary embodiment of the invention as shown in the accompanying drawings, the spacer-support 11 comprises a substantially rectangular upper frame structure 12 provided on its lower end with a flexible locking member 13 for securing the spacer-support to a chassis 14 or one to another, as hereinafter more particularly described.

The frame structure 12 is comprised of a bottom wall 15 having two spaced side walls 16 extending upwardly therefrom, and which are bridged by a top wall 17. The flexible locking member 13 is integral with and depends from the bottom wall 15. The locking member includes a base 18 joined to the bottom wall 15 by a web 19 and having flexure grooves 21 on either side thereof, and a prong 22 comprised of a stem 23 having reverse extending fingers 24 upon the free ends of each of which there are shoulders 25.

In use, the flexible locking member 13 is inserted in an aperture 26 in the chassis 14. In so doing, the spacer-support is depressed, thereby deforming the arched base 18 an amount sufficient to carry the fingers 24 through the aperture, whereupon their shouldered ends 25 engage the margins of the chassis surrounding the aperture 26. These fingers, together with the arched base 18, lock the spacer-support 11 to the chassis 14.

To mount a circuit board 27 on the spacer-support 11, said board is laid thereover and a second spacer-support **11*a* has its flexible locking member 13*a* extended through an aperture 29 in the top wall of the frame structure 12 of the first spacer-support in such a manner that its fingers 24*a* engage beneath the top wall 17. A third circuit board 31 can be laid over the top wall 17*a* of the second spacer-support and a resilient cap 32, which includes a flexible locking member 13*b*** can be secured in place thereover. The circuit boards are thus locked to one another and to the chassis.

Any multiple of layers of circuit boards and other components may thus be spaced apart and stacked, through the use of multiple spacer-supports 11.

The spacer-support herein disclosed is preferably injection molded in one piece from nylon, although other moldable materials having dielectric insulating properties may be utilized. Obviously, the spacer-support herein disclosed may be used in any application where it is desired to mount an apertured component in stacked and spaced apart relation over an underlying apertured surface, and to stack such components in spaced relationship through the use of multiple spacer-supports; and the use of the spacer-support is not limited to the stacking of circuit boards.

Although I have described a preferred embodiment of my invention in considerable detail, it will be understood that the description thereof is intended to be illustrative rather than restrictive, as details of the structure may be modified or changed without departing from the spirit or scope of the invention. Accordingly, I do not desire to be restricted to the exact construction described and shown.

I claim:

1. A chassis and component assembly, comprising an apertured chassis and an apertured component, a one-piece spacer-support of plastic dielectric material mounting the component on the apertured chassis, said spacer-support consisting of a rigid frame structure having an apertured top wall and a bottom wall, a resiliently yieldable base integral with the bottom wall, a locking member integral with the base, the locking member extending through the aperture in the chassis to secure said spacer-support to the chassis, and means including a locking member extending through the apertures in the component and top wall of the spacer-support to secure the component to said spacer-support and to the chassis, said locking members being resiliently flexible.

2. The assembly recited in claim 1, wherein the means comprises a second spacer-support.

3. The assembly recited in claim 1, wherein the means comprises a cap.

4. A one-piece spacer-support of plastic dielectric material for mounting a component on a chassis, said spacer-support comprising a substantially rectangular frame structure including a top wall and a bottom wall, and connecting side walls, a base integral with the bottom wall and being resiliently yieldable in an axial direction, a resiliently flexible first locking member integral with the base and extending outwardly therefrom, said top wall being apertured to receive a second locking member for resiliently flexibly securing a component to the frame structure.

5. The spacer-support recited in claim 4, wherein a thin web connects the base to the bottom wall.

6. The spacer-support recited in claim 4, wherein the first locking member comprises a stem having fingers integral with said stem at one end thereof.

* * * * *